United States Patent [19]

Shiga

[11] Patent Number: 5,723,904
[45] Date of Patent: Mar. 3, 1998

[54] PACKAGED SEMICONDUCTOR DEVICE SUITABLE TO BE MOUNTED AND CONNECTED TO MICROSTRIP LINE STRUCTURE BOARD

[75] Inventor: Nobuo Shiga, Kanagawa, Japan

[73] Assignee: Sumitomo Electric Industries, Ltd., Osaka, Japan

[21] Appl. No.: 208,267

[22] Filed: Mar. 10, 1994

[30] Foreign Application Priority Data

Mar. 10, 1993 [JP] Japan ................ 5-076104

[51] Int. Cl.$^6$ .................. H01L 23/02; H01L 23/12
[52] U.S. Cl. .................. 257/698; 257/704
[58] Field of Search .................. 257/698, 704, 257/692, 691, 710

[56] References Cited

U.S. PATENT DOCUMENTS

| 4,751,482 | 6/1988 | Fukuta et al. | 257/691 |
|---|---|---|---|
| 5,045,922 | 9/1991 | Kodoma | 257/698 |
| 5,067,007 | 11/1991 | Kanji et al. | 257/698 |
| 5,081,067 | 1/1992 | Shimizu et al. | 257/698 |
| 5,166,773 | 11/1992 | Temple | 257/678 |
| 5,237,204 | 8/1993 | Val | 257/698 |
| 5,306,948 | 4/1994 | Yamado et al. | 257/691 |
| 5,311,059 | 5/1994 | Banerji et al. | 257/691 |

OTHER PUBLICATIONS

IBM Technical Disclosure Bulletin, vol. 31, No. 4, Sep. 1988 New York pp. 37372–37373 "Thermal Enhancement of Thermal Cap".

Primary Examiner—Mahshid D. Saadat
Assistant Examiner—S. V. Clark
Attorney, Agent, or Firm—Kerkam, Stowell, Kondracki & Clarke, P.C.; John C. Kerins

[57] ABSTRACT

A package semiconductor device comprises an insulating substrate having an upper surface formed with a plurality of connection pads and an under surface formed with a plurality of external connection members each of which is electrically connected to a corresponding one of the connection pads through a via hole formed through the insulating substrate. An integrated circuit chip is bonded face-down on the upper surface of the insulating substrate so that the integrated circuit chip is electrically connected to the connection pads through solder bumps. An electrically conductive cap is covered on the first surface of the insulating substrate so that the integrated circuit chip is encapsulated in a space defined by the insulating substrate and the conductive cap. A back electrode of the integrated circuit chip is electrically connected to the conductive cap through an electrically conducting element.

5 Claims, 10 Drawing Sheets

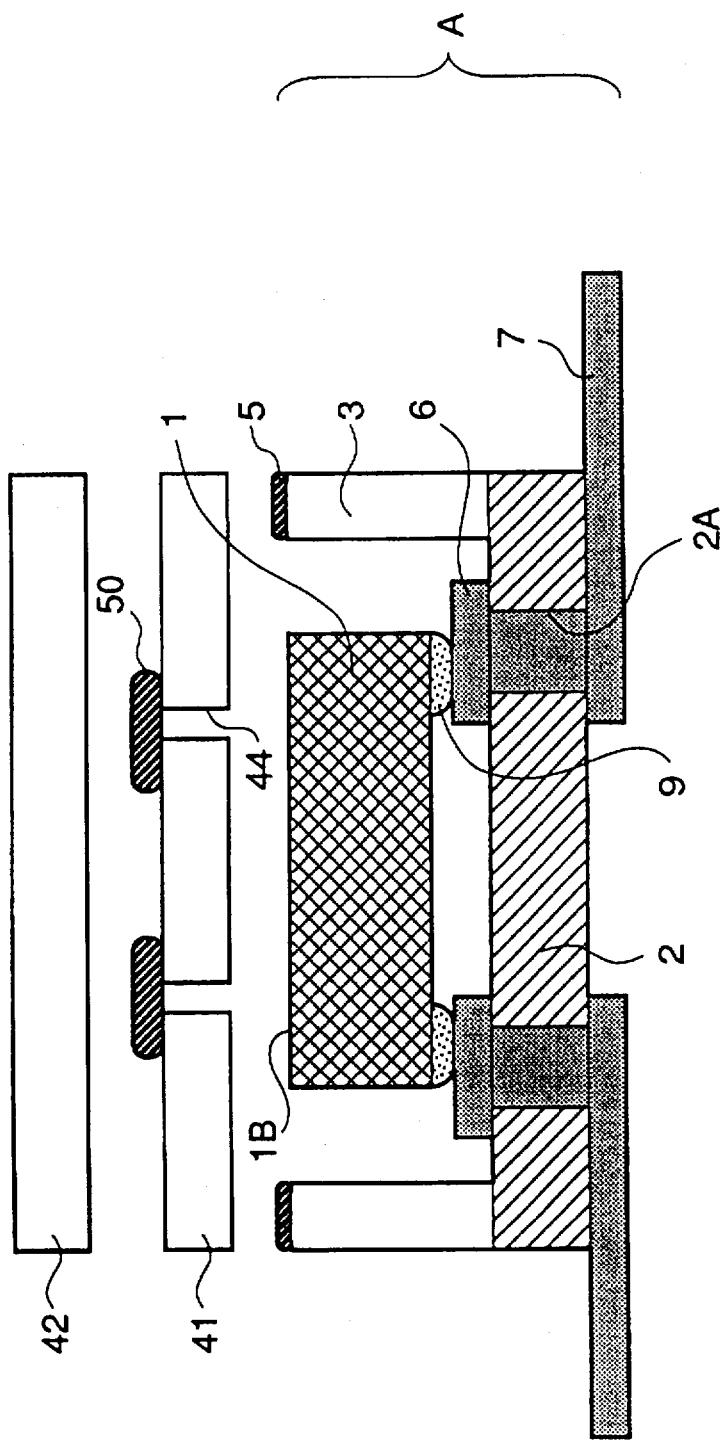

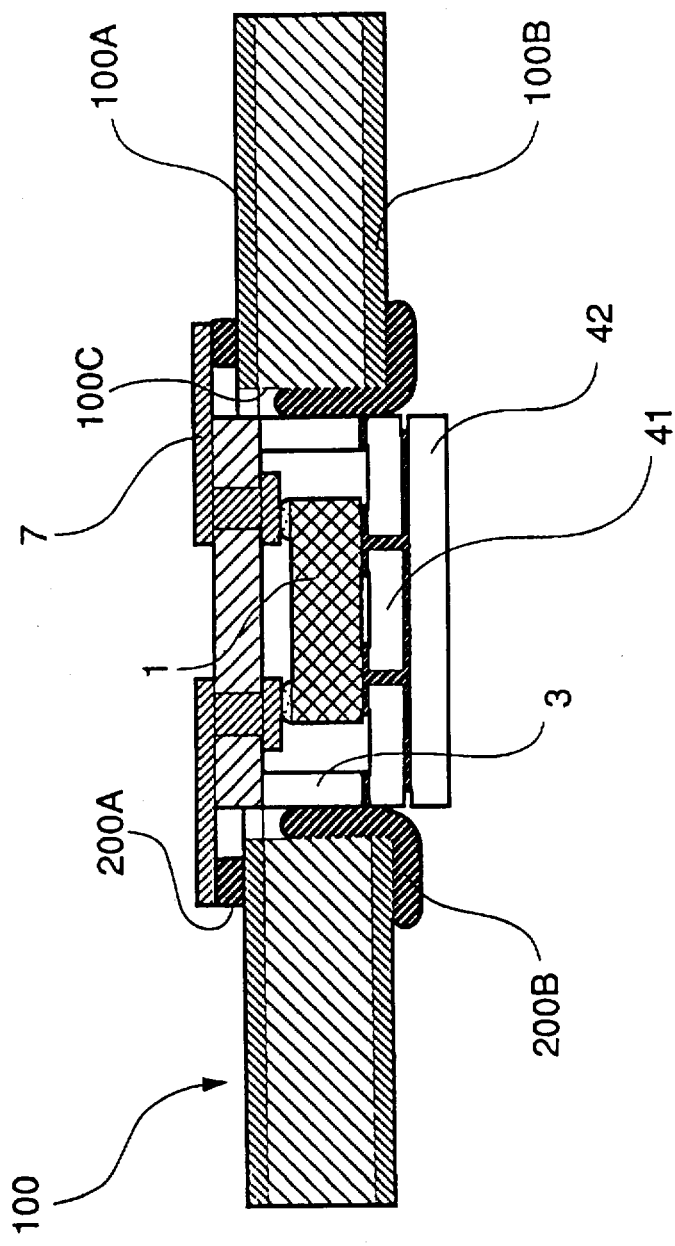

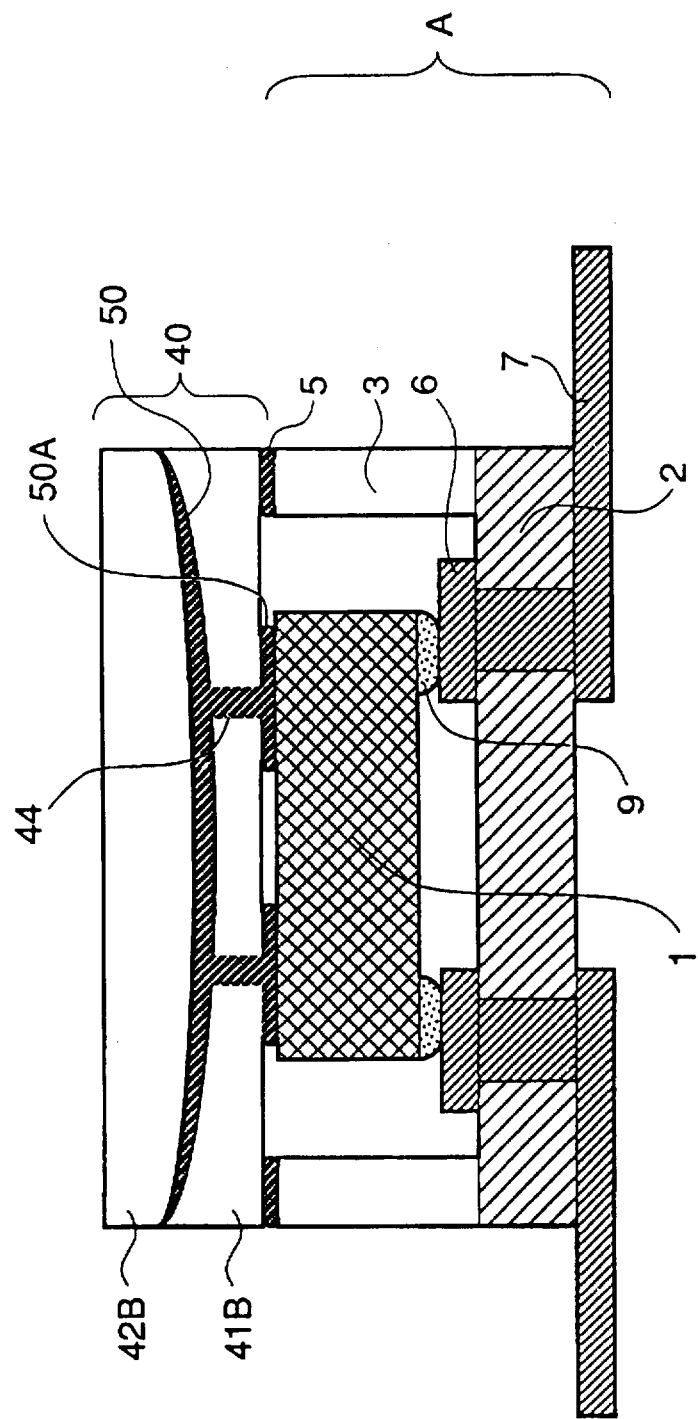

PACKAGED SEMICONDUCTOR DEVICE SUITABLE TO BE MOUNTED AND CONNECTED TO MICROSTRIP LINE STRUCTURE BOARD

BACKGROUND OF THE INVENTION

1. Field of the Invention

The present invention relates to a semiconductor device, and more specifically to a semiconductor device containing an integrated circuit chip packaged in a flip-chip bonding and having a novel structure suitable to be mounted and connected to a microstrip line structure.

2. Description of Related Art

At present, high-speed information network systems and satellite communication systems are being rapidly developed, and therefore, a demand for a semiconductor device operating in a high frequency band such as UHF (ultrahigh frequency), SHF (superhigh frequency) and EHF (extremely high frequency) is now increasing. On the other hand, FET (field effect transistor), in particular, MESFET (metal semiconductor FET) and HEMT (high electron mobility transistor) formed of a compound semiconductor typified by GaAs, are expected as a device capable of breaking down a limitation in characteristics of silicon bipolar transistors conventionally used in the high frequency band, and practical use of these elements is being promoted.

It has been confirmed that high frequency IC (integrated circuit) chips including GaAsFETs have an extremely high performance. However, packaged or encapsulated high frequency integrated circuit chips cannot, in many cases, exert the excellent performance of the IC chips themselves.

SUMMARY OF THE INVENTION

Accordingly, it is an object of the present invention to provide a packaged semiconductor device which has overcome the above mentioned defect of the conventional one.

Another object of the present invention is to provide a packaged semiconductor device capable of exerting an excellent performance of the integrated circuit chips themselves without being impaired.

The above and other objects of the present invention are achieved in accordance with the present invention by a package semiconductor device comprising:

an insulating substrate having a first surface foraged with a plurality of connection pads and a second surface formed with a plurality of external connection members each of which is electrically connected to a corresponding one of the connection pads through a via hole formed through the insulating substrate;

an integrated circuit chip bonded facedown on the first surface of the insulating substrate so that the integrated circuit chip is electrically connected to the connection pads through solder bumps, the integrated circuit chip having a back electrode romped on a back surface thereof; and an electrically conductive cap covered on the first surface of the insulating substrate so that the integrated circuit Chip is encapsulated in a space defined by the insulating substrate and the conductive cap, the back electrode of the integrated circuit chip being electrically connected to the conductive cap.

Specifically, the back electrode of the integrated circuit chip is electrically connected through an electrically conducting element to the conductive cap.

In one embodiment of the package semiconductor device, the conductive cap is composed of a side wall bonded at its lower end to the insulating substrate so as to surround the integrated circuit chip and a lid plate bonded to an upper end of the side wall, and wherein the electrically conducting element is foraged of a contact plate having a central region mechanically contacted and electrically connected to the back electrode of the integrated circuit chip, the contact plate also including a peripheral portion sandwiched and electrically connected between the lid plate and the upper end of the side wall.

Preferably, the contact plate is in the form of a lead frame having a plurality of legs radially outwardly extending from the central region, a tip end of each of the plurality of legs being sandwiched and electrically connected between the lid plate and the upper end of the side wall.

In another embodiment of the package semiconductor device, the conductive cap is composed of a side wall bonded at its lower end to the insulating substrate so as to surround the integrated circuit chip and a lid structure bonded to an upper end of the side wall, the lid structure being bonded and electrically connected to the back electrode of the integrated circuit chip through a solder.

More specifically, the lid structure includes a first lid member bonded to the upper end of the side wall, the first lid member having a plurality of via holes formed through the first lid member, and a second lid member bonded to the first lid member through a solder, the solder filling the via holes and extending to a lower surface of the first lid member so as to mutually bond the the first lid member and the back electrode of the integrated circuit chip.

The above and other objects, features and advantages of the present invention will be apparent from the following description of preferred embodiments of the invention with reference to the accompanying drawings.

BRIEF DESCRIPTION OF THE DRAWINGS

FIGS. 3A to 3C are diagrammatic sectional views illustrating a process for manufacturing the packaged semiconductor device shown in FIG. 2;

FIG. 6 is a diagrammatic sectional view of the packaged semiconductor device assembled into an assemble circuit board of the microstrip line structure;

FIG. 7 is a diagrammatic sectional view of a modification of the packaged semiconductor device shown in FIG. 2;

DESCRIPTION OF THE PREFERRED EMBODIMENTS

Figure 1:
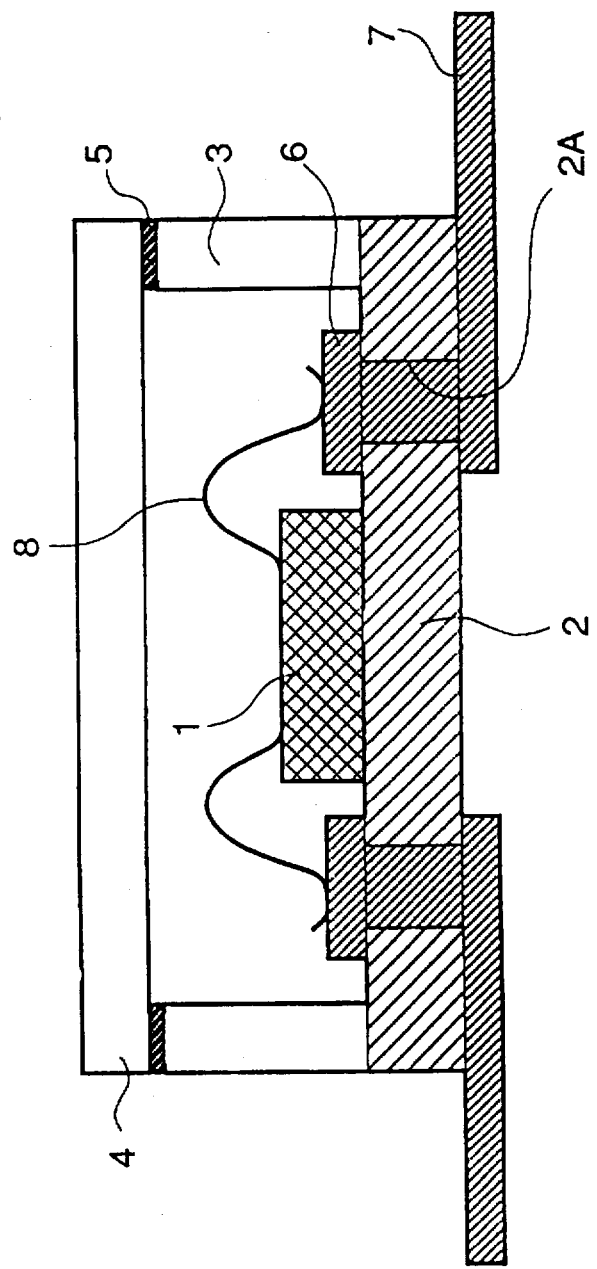
FIG. 1 is a diagrammatic sectional view of one typical conventional packaged semiconductor device.

Referring to FIG. 1, there is shown a diagrammatic sectional view of one typical conventional packaged semiconductor device.

The shown semiconductor device includes a microwave IC (integrated circuit) chip 1 die-bonded on an upper surface of a substrate 2 formed of for example a ceramics. The upper surface of a substrate 2 is covered with a metal cap, which is formed of a side wall 3 air-tightly bonded to a periphery of the upper surface of the substrate 2 so as to surround the IC chip I remotely from the IC chip 1, and a lid 4 air-tightly bonded to an upper end of the side wall 3 by means of a solder 5. A plurality of contact pads 6 are formed on the upper surface of the substrate 2 to be located between an IC chip die bonding area and the side wall 3, and a plurality of lead pins 7 are fixed to an under surface of the substrate 2 so as to outwardly extend beyond the substrate. Each of the connection pads 6 is electrically connected to a corresponding one of the lead pins 7 through a via-hole 2A formed through the substrate 2 and filled with an electrically conducting material. Each of contact pads (not shown) formed on an upper surface of the IC chip 1 is connected to a corresponding one of the connection pads 6 through a bonding wire 8.

Examining the above mentioned packaged microwave IC chip, since the bonding wires 8 are formed of a thin metal wire, the bonding wires 8 have a substantial parasitic inductance. The applicant considers that this parasitic inductance inevitably deteriorates the characteristics of the device, particularly in a high frequency. Namely, This is one of major causes preventing exertion of the excellent performance of the high frequency IC chips.

In order to avoid use of the bonding wires, it may be considered to use a so called flip-chip bonding, in which the IC chip is connected through bumps formed of for example gold or solder. In this flip-chip bonding, the IC chip is bonded on a substrate in such a manner that a pad-formed surface of the IC chip is faced down to an upper surface of the substrate. Therefore, no attention is paid to an electrical connection to a back electrode formed on the back surface of the IC chip. Accordingly, this type of package cannot be used for mounting a microwave IC on a circuit board of the microstrip line type having a ground plane which is formed on the under surface of the circuit board and which needs to be connected to the back electrode of the IC. Namely, the flip-chip bonding is not compatible to the microstrip line structure.

In this connection, it may be also considered to make the IC chip into a uniplanar structure requiting no ground plane formed on the back surface of the IC chip. In this uniplanar structure, since all circuit elements including the ground lines are located at the upper surface of the IC chip, even if the IC chip is packaged in the flip-chip bonding, there occurs no problem for connecting to the ground plane formed of the back electrode of the IC chip. However, a transmission line formed in the uniplanar structure inevitably has a loss substantially larger than a microstrip line. Accordingly, this uniplanar structure cannot be applied to a low-noise amplifier IC Under the above mentioned circumstance, the applicant has succeeded in provide a packaged semiconductor device capable of exerting an excellent performance of the IC chips themselves without being impaired, by the applicant's unique conception which makes it possible to electrically connect the ground plane formed of the back electrode of the IC chip to the ground plane of the microstrip line type board, with using no bonding wire inevitably having a substantial parasitic inductance.

Figure 2:
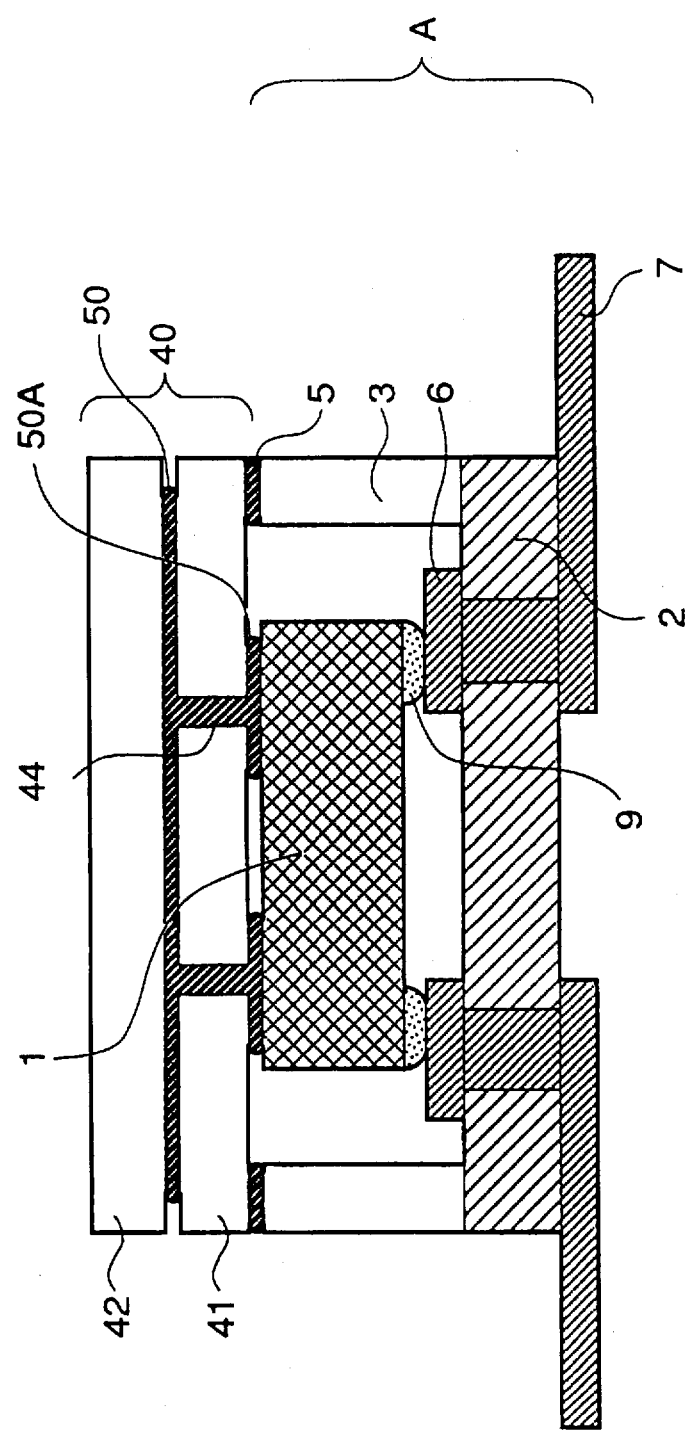
FIG. 2 is a diagrammatic sectional view of a first embodiment of the packaged semiconductor device in accordance with the present invention.

Referring to FIG. 2, there is shown a diagrammatic sectional view of a first embodiment of the packaged semiconductor device in accordance with the present invention. In FIG. 2, elements similar or corresponding to those shown in FIG. 1 are given the same Reference Numerals, and explanation thereof will be omitted.

As would be seen from comparison between FIGS. 1 and 2, the IC chip 1 is mounted on the upper surface of the substrate 2 in a flip-chip bonding manner. Namely, the IC chip I is flipped, in comparison with the conventional example shown in FIG. 1, so that each of the contact pads formed on the faced-down upper surface of the IC chip I is electrically connected and mechanically fixed through a bump 9 to a corresponding connection pad 6 formed at the upper surface of the substrate, by using no bonding wire. Accordingly, the structure of a portion "A" under the level of an upper end of the side wall 3 is substantially similar to a corresponding portion of the conventional example shown in FIG. 1, except that the IC chip 1 is mounted in a flip-chip bonding manner.

On the other hand, a lid structure 40 of this embodiment has a unique structure substantially different from the conventional example shown in FIG. 1. The lid structure 40, air-tightly bonded, namely, sealed to the upper end of the side wall 3 by means of a solder 5, includes a first lid member 41 and a second lid member 42 stacked on the first member 41. The side wall 3 and the first and second lid members 41 and 42 are formed of a metal material, for example, gold-plated Kovar.

A periphery of an under surface of the first lid member 41 is air-tightly bonded to the upper end of the side wall 3 by means of the solder 5, which is formed of for example a gold-tin alloy, and the second lid member 41 is bonded to a substantial whole of an upper surface of the first lid member 41 through a solder 50, which is also foraged of for example a gold-tin alloy. In addition, the first lid member 41 has a plurality of via holes 44 penetrating through the first lid member 41, and the solder 50 fills the via holes 44, and furthermore, reaches and bonds to the faced-up back surface of the IC chip 1. Solders 50A flowed over through the via holes 44 bonds between the faced-up back surface of the IC chip 1 and the under surface of the first lid member 41.

With the above mentioned arrangement, the faced-up back electrode of the IC chip 1 is electrically connected through the solder 50 to the lid structure 40, and hence to the metallic cap composed of the lid structure 40 and the side wall 3. Accordingly, if the cap composed of the lid structure 40 and the side wall 3 is used as the ground plane of a microstrip line structure, the shown packaged semiconductor device can constitute a transmission line of the microstrip line structure in which the cap composed of the lid structure 40 and the side wall 3 forms the ground plane and the lead pins 7 form individual signal conductors. Furthermore, since the IC chip 1 is completely hermetically encapsulated by the substrate 2 and the lid structure 40, the finished packaged semiconductor device can be handled similarly to conventional packaged semiconductor devices.

Now, a process for manufacturing the above mentioned packaged semiconductor device will be explained with reference to FIGS. 3A to 3C.

Figure 3A:
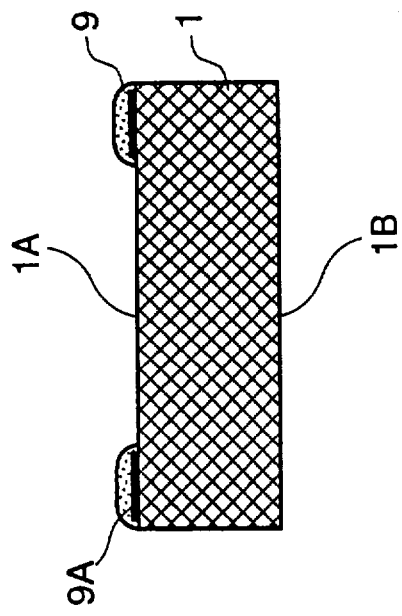

As shown in FIG. 3A, pre-formed solder bumps 9, which are formed of for example Pb-Sn solder or gold, are located on contact pads 9A formed on an upper surface 1A of the IC chip 1. A back electrode (ground electrode) is formed to cover an under surface 1B of the IC chip 1.

Figure 3B:
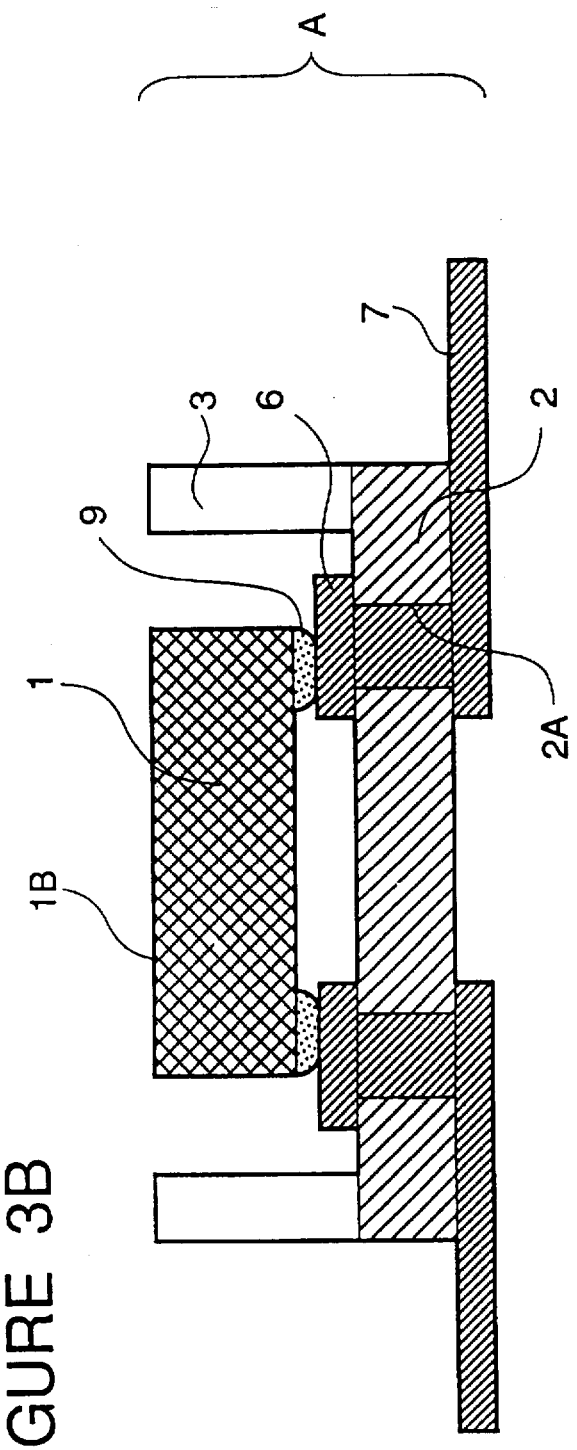

Then, the IC chip 1 having the solder bumps 9 is bonded facedown on the substrate 2 which has been assembled with the side wall 3 and the lead pins 7 as shown in FIG. 3B, so that the bumps 9 are directly above corresponding connection pads 6 formed on the substrate 1. All the contact pads formed on an upper surface of the IC chip 1 are simultaneously bonded to the corresponding connection pads 6 formed on the substrate 1 by melting the pre-formed solder bumps 9. Thus, as shown in FIG. 3B, the IC chip 1 is bonded to the substrate 2 in the flip-chip bonding.

Thereafter, as shown in FIG. 3C, pre-formed solder bumps 5 are put on an upper end surface of the side wall 3, and then, the first lid member 41 is located on the pre-formed solder bumps 5, and further, pre-formed solders 50 are put on the via holes 44 of the first lid member 41, and finally, the second lid member 42 is located on the first lid member 41. The solders 50 are preferred to be formed of gold-fin eutectic crystal.

Suitable heat and pressure are applied onto the stacked first and second lid members 41 and 42 so as to force the first and second lid members 41 and 42 to the side wall 3, so that the first lid member 41 is bonded to the upper end of the side wall 3 by the solder 5, and simultaneously, the second lid member 42 is bonded to the first lid member 41 by the solder 50. Furthermore, the molten solder 50 flows through the via holes 44 onto the faced-up back surface of the IC chip 1, so that the via holes 44 are filled with the solder 50 and the faced-up back surface of the IC chip 1 is bonded to the stacked and bonded first and second lid members 41 and 42 through the solder 50A, as shown in FIG. 2.

Here, the amount of the pre-formed solders 50 to be sandwiched between the first and second lid members 41 and 42 before the bonding, is a very significant control parameter. The pre-formed solders 50 have not only a function of filling up the via holes 44 of the first lid member 41 and of air-tightly and integrally forming the package, but also another function of simultaneously electrically connecting the back electrode of the IC chip 1 to the package. Accordingly, the amount of the pre-formed solders 50 must be sufficient to achieve both of the above mentioned functions, but if the amount of the pre-formed solders 50 is too large, the solder flows into a portion of an internal space of the package to which the solder is not to be flowed, and causes a short-circuit within the package.

For realizing a good controllability of spreading of the solder so as to uniformly spread the solder over only a necessary area, the following method is proposed.

First, as shown in FIGS. 4A to 4D, it is preferred to form a balanced shape and arrangement of via holes 44 so as to ensure that when the first and second lid members 41 and 42 are bonded, the solders 50 are uniformly and smoothly spread and supplied to the under surface of the first lid member 41.

Figure 4A:
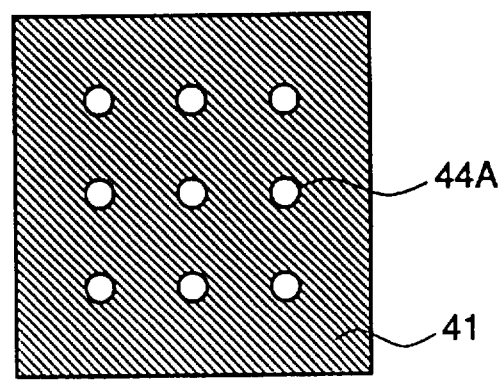
FIGS. 4A to 4D illustrate various via hole patterns formed in the lid member provided in the packaged semiconductor device shown in FIG. 2.
Figure 4B:
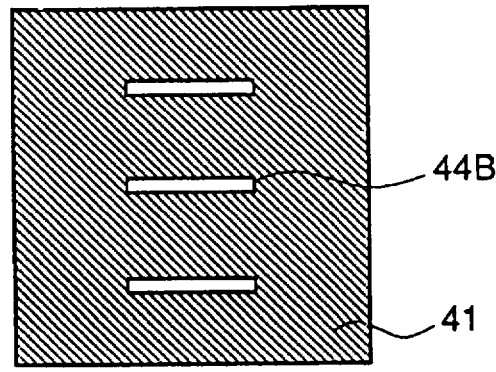

For example, as shown in FIG. 4A, a plurality of via holes 44A having the same shape, for example, a circles having the same diameter, can be formed in the first lid member 41 at equal intervals both in a vertical direction and in a horizontal direction. Alternatively, a plurality of linear elongated via holes 44B having the same width and the same length (in a horizontal direction) can be formed in the first lid member 41 at equal intervals in a vertical direction.

Figure 4C:
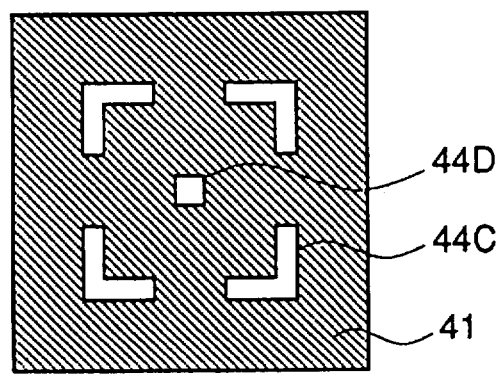
Figure 4D:
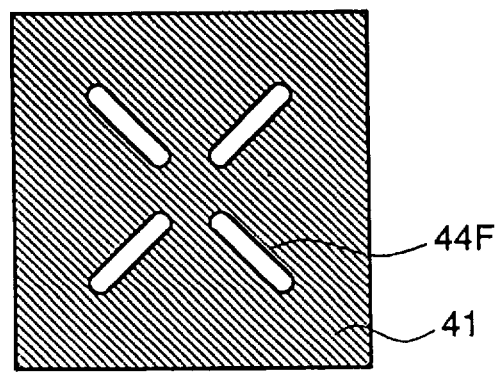

Furthermore, a plurality of via holes having different shapes can be formed in the first lid member 41 as shown in FIG. 4C. In the example shown in FIG. 4C, four L-shaped via holes 44C having the same width are formed to define four corners of an imaginary square, and a square via hole 44D is formed at a center of the imaginary square. In addition, as shown in FIG. 4D, a plurality of linear elongated via holes 44F having the same width and the same length can be formed in the first lid member 41 at equal angular intervals to outwardly radially extend from a center region of the first lid member 41.

However, the shape and the location of the via holes 44 are not limited to the shown example, and can be freely determined in the extent capable of uniformly and smoothly spreading and supplying the solders 50 to the under surface of the first lid member 41.

Furthermore, it is preferred to form a construction for restricting the spreading of the solders 50, on the upper surface of the first lid member 41, the under surface of the first lid member 41 and/or the faced-up back surface of the IC chip 1 (on which the back electrode is formed).

Figure 5A:
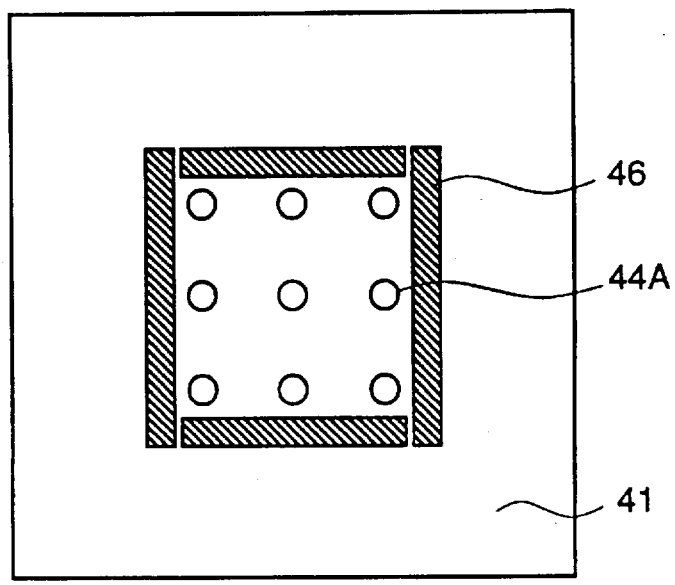
FIG. 5A illustrates the lid member having the via holes surrounded by the solder spreading limiting area.
Figure 5B:
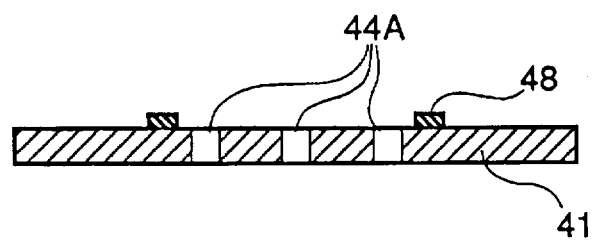
FIG. 5B illustrates the lid member having the via holes surrounded by the solder spreading limiting dam structure.

For example, as shown in FIG. 5A, all the via holes 44A formed as shown in FIG. 4A are substantially surrounded by a solder spreading limiting area 46, which is formed of a material having a small or less wetting property to the material of the solder 50. Alternatively, to physically damming up the spreading of the solder 50, the solder spreading limiting area 46 having the small wetting property can be replaced with a dam structure 48 formed on the first lid member 41 so as to completely surround all the via holes 44A, as shown in FIG. 5B.

Figure 5C:
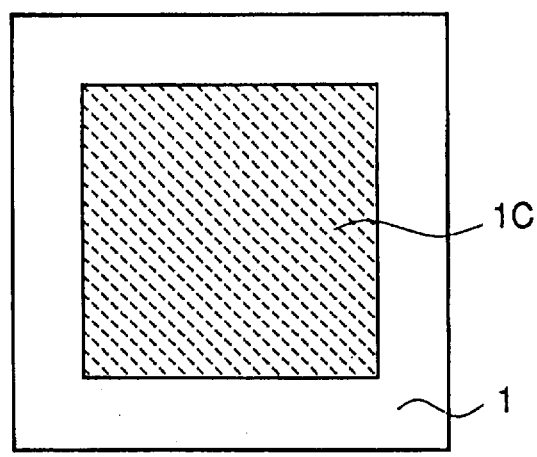
FIG. 5C illustrates a metallized area formed as the back electrode on the back surface of the IC chip.

Furthermore, a similar effect can be obtained if a metallized area 1C formed as the back electrode on the faced-up back surface of the IC chip 1 is confined so that a non-metallized area is left at a periphery of the back surface of the IC chip 1, as shown in FIG. 5C. Since a non-metallized surface of the IC chip 1 has a remarkably low wetting property to the solder material, the solder will effectively spread over only the metallized area.

With the above mentioned various arrangements, it is possible to prevent an extra conductive solder from flowing within the package so as to cause a trouble such as short-circuiting. In addition, and more importantly, since the extent of the solder spreading can be accurately determined, it is also possible to precisely determine the necessary and sufficient amount of solder. Accordingly, if the necessary and sufficient amount of solder are given, the solder can be sufficiently supplied and spread over the confined area. It is a matter of course that any one of the above mentioned various arrangements can be used alone, but also, two or more of the above mentioned various arrangements can be used in combination.

The above mentioned packaged semiconductor device can be very easily assembled into an assemble circuit board 100 of the microstrip line structure having a plurality of signal conductors or circuit pattern conductors 100A formed on an upper surface thereof and a ground plane 100B formed on an under surface thereof, as shown in FIG. 6.

Namely, an opening 100C sufficient to receive the cap portion of the packaged semiconductor device is formed through the assemble circuit board 100, and the cap portion of the packaged semiconductor device is inserted into the opening 100C in such a manner that the lead pins 7 are located at the side of the circuit pattern conductors 100A. In this condition, each of the lead pins 7 can be connected to a corresponding one of the plurality of circuit pattern conductors 100A through a solder 200A located on the circuit pattern conductors 100A, and the cap portion formed of the side wall 3 and the lid structure 40 can be connected to the ground plane 100B by a solder 200B which is filled into a gap formed between the cap of the package and an inner surface of the opening 100C and which extends over the ground plane 100B. With this assembling, since the back electrode 1C of the IC chip 1 is electrically connected to the cap portion formed of the side wall 3 and the lid structure 40, the lead pins 7 can be connected to the circuit pattern conductors 100A with a minimum distance, and the back electrode 1C of the IC chip 1 is connected to the ground plane 100B with a minimum distance.

Referring to FIG. 7, there is shown a diagrammatic sectional view of a modification of the packaged semiconductor device shown in FIG. 2. In FIG. 7, elements similar to those shown in FIG. 2 are given the same Reference Numerals, and explanation thereof will be omitted for simplification of description.

As will be seen from comparison between FIGS. 2 and 7, the shown modification is characterized in that the lid structure 40 is formed of a first lid member 41B having a concave upper surface formed of a partial spherical surface and a second lid member 42B having a convex lower surface formed of a partial spherical surface, which is substantially complementary to the concave upper surface of the first lid member 41B.

In the case that the first and second lid members 41 and 42 are formed of a simple planar plate as shown in FIG. 2, when it is attempted to uniformly spread the solders 50 for the purpose of fixing the lid members, it is necessary to press the lid members while accurately maintaining the lid members in a horizontal condition. However, this is actually difficult. This operation can be made simple and easy, by cooperation of the smooth curved upper surface of the second lid member 41B and the smooth curved under surface of the first lid member 42B, since it no longer necessary to accurately maintain the lid members in a horizontal condition. In addition, if the radius of curvature in the smooth curved upper surface of the first lid member 41B is made smaller than that in the smooth curved under surface of the second lid member 42B, when the pressure is applied to the lid members, the solder 50 can be effectively collected to a center region of the concave upper surface of the lid member 41B so that the solder can be pushed out through the via holes 44 by the convex lower surface of the lid member 42B. Accordingly, this arrangement makes it possible to manufacture the packaged semiconductor device on the basis of a mass production.

Figure 8A:
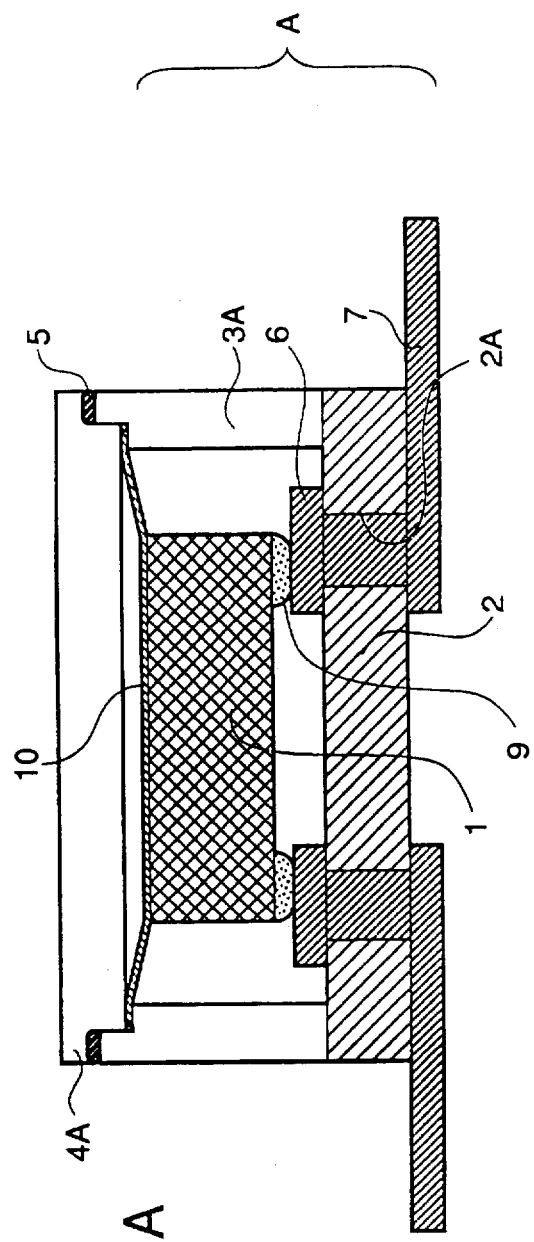
FIG. 8A is a diagrammatic sectional view of a second embodiment of the packaged semiconductor device in accordance with the present invention.

Referring to FIG. 8A, there is shown a diagrammatic sectional view of a second embodiment of the packaged semiconductor device in accordance with the present invention. In FIG. 8A, elements similar or corresponding to those shown in FIG. 2 are given the same Reference Numerals, and explanation thereof will be omitted.

As will be apparent from comparison between FIGS. 2 and 8A, the structure of a portion "A" under a level somewhat lower than the level of the upper end of the side wall in the second embodiment is substantially similar to a corresponding portion of the first embodiment shown in FIG. 2, but the second embodiment is similar to the conventional example shown in FIG. 1 in that the side wall is covered with the rid of a single plate.

Figure 8B:
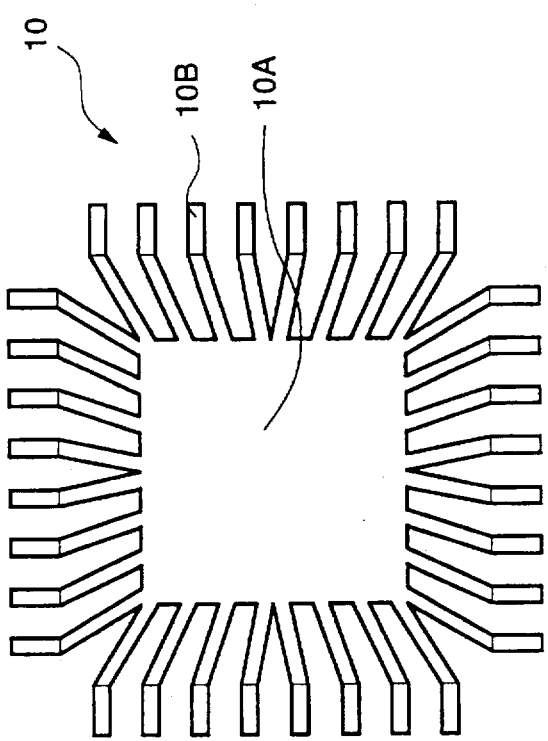
FIG. 8B illustrates a pattern of one example of the contact plate provided in the packaged semiconductor device shown in FIG. 8A.
Figure 8C:
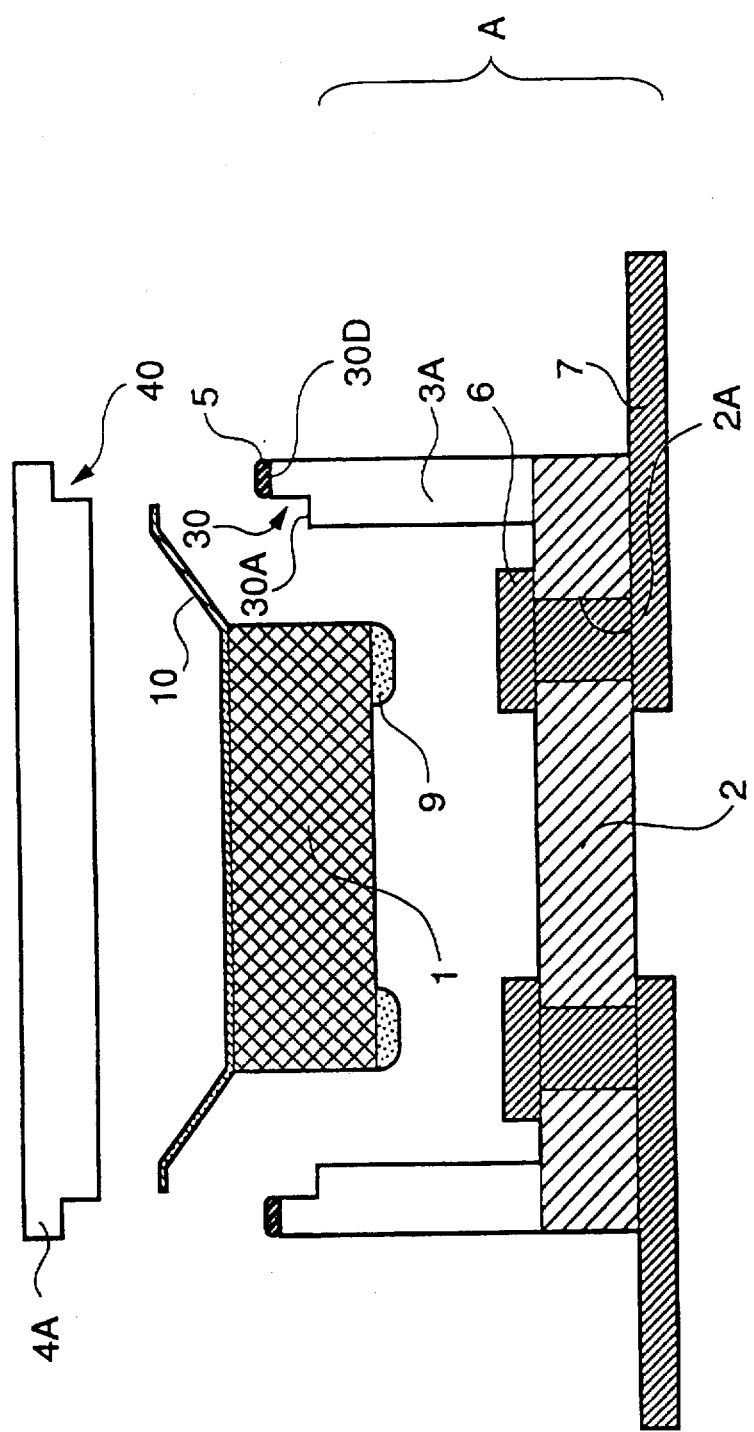
FIG. 8C is an exploded sectional view of the packaged semiconductor device shown in FIG. 8A.

However, as shown in an exploded sectional view of FIG. 8C, a step 30 is formed on an upper end of a side wall 3A so that the upper end 30A of an inside portion of the side wall 3A is lower than the upper end 30D of an outside portion of the side wall 3A. In addition, a step 40 is correspondingly formed at a lower side of a periphery of a lid plate 4A so that the lid plate 4A can be fitted onto the stepped upper end of a side wall 3A. Furthermore, a contact plate 10 in the form of a lead frame is located on and contacted to the faced-up back surface of the IC chip 1 with a periphery of the contact plate 10 being sandwiched and fixed between the lower surface of the lid plate 4A and the upper end 30A of the inside portion of the side wall 3A.

As shown in FIG. 8B, this contact plate 10 has a central region 10A having a size substantially corresponding to the back surface of the IC chip 1, and a plurality of legs 10B radially outwardly extending from the central region 10A, like lead pins of a lead frame. The overall size of the contact plate 10 is slightly smaller than the size determined by the contour of the step 30, in order to ensure that the plurality of legs 10B can be smoothly put on the upper end 30A of the inside portion of the side wall 3A.

As shown in FIGS. 8A and 8C, the central region 10A of the contact plate 10 is bent downward from the plurality of legs 10B. In other words, the plurality of legs 10B of the contact plate 10 is bent slightly upward from the central region 10A of the contact plate 10.

In addition, if the plurality of legs 10B of the contact plate 10 is previously bent to a suitable degree as shown in FIG. 8C, when the lid plate 4A is fitted and fixed to the side wall 3A, the plurality of legs 10B of the contact plate 10 are caused to be resiliently deformed between the faced-up back surface of the IC chip 1 and the cap formed of the side wall 3A and the lid plate 4A, so as to ensure a mechanical contact and an electrical connection between the contact plate 10 and the faced-up back surface of the IC chip 1 in the case that the back surface of the IC chip 1 is not previously bonded to the central region 10A of the contact plate 10.

Now, a process for manufacturing the packaged semiconductor device shown in FIG. 8A will be explained with reference to FIG. 8C.

For example, firstly, the back surface of the IC chip 1 is bonded to the central region 10A of the contact plate 10, and then, solder bumps 9 are located on contact pads formed on the upper surface of the IC chip 1. The IC chip thus prepared is bonded facedown on the substrate 2 which has been assembled with the side wall 3A and the lead pins 7, so that the bumps 9 are directly above corresponding connection pads 6 formed on the substrate 1 and the plurality of legs 10B are put on the upper end 30A of the inside portion of the side wall 3A.

Thereafter, pre-formed solder bumps 5 are put on the upper end surface of the outside portion of the side wall 3A, and then, the lid plate 4A is fitted onto the upper end of the side wall 3A so that the step 40 of the lid plate 4A is fitted with the step 30 of the side wall 3A. Suitable heat and pressure are applied onto the lid plate 4A so as to force the lid plate 4A to the side wall 3A, so that the lid plate 4A is bonded to the upper end of the side wall 4A by the solder 5, and simultaneously, with the legs 10B of the contact plate 10 are sandwiched and fixed between the lower surface of the lid plate 4A and the upper end 30A of the inside portion of the side wall 3A. Thus, the air-tight package is completed, and at the same time, the faced-up back surface of the IC chip 1 is electrically connected through the contact plate 10 to the cap formed of the side wall 3A and the lid plate 4A, and the contact plate 10 is sandwiched and fixed between the side wall 3A and the lid plate 4A.

As will be apparent from the above, the packaged semiconductor device in accordance with the present invention is characterized in that the IC chip is packaged in the flip-chip bonding with using no bonding wire, and also, the back electrode of the IC chip is electrically connected to the metallic cap of the package. Accordingly, the back electrode of the IC chip can be electrically connected to a ground plane of a microstrip line structure through the metallic cap of the package, and since no bonding wire is used, it is possible to prevent deterioration of the IC chip which would otherwise be caused by the bonding wires.

In other words, the packaged semiconductor device suitable to microstrip line structure can be realized with using no bonding wire, and in accordance with the flip-chip bonding.

Therefore, the packaged semiconductor device in accordance with the present invention can be used in a microstrip line structure indispensable to a low noise amplifier. Accordingly, a high performance semiconductor device which can be used in a microwave band, can manufactured inexpensively and at a high productivity.

The invention has thus been shown and described with reference to the specific embodiments. However, it should be noted that the present invention is in no way limited to the details of the illustrated structures but changes and modifications may be made within the scope of the appended claims.

I claim:

1. A packaged semiconductor device comprising:

an insulating substrate having a first surface formed with a plurality of connection pads and a second surface formed with a plurality of external connection members each of which is electrically connected to a corresponding one of said connection pads through a via hole formed through said insulating substrate;

an integrated circuit chip bonded facedown on said first surface of said insulating substrate so that said integrated circuit chip is electrically connected to said connection pads through solder bumps, said integrated circuit chip having a back electrode formed on a back surface thereof;

an electrically conductive cap covered on said first surface of said insulating substrate, wherein said cap is not electrically connected with any of said plurality of connection pads on said first surface so that said integrated circuit chip is encapsulated in an empty space defined by said insulating substrate and said conductive cap, said back electrode of said integrated circuit chip being electrically connected to said conductive cap;

wherein said back electrode of said integrated circuit chip is electrically connected through an electrically conducting element to said conductive cap; and wherein said conductive cap is composed of a side wall bonded at its lower end to said insulating substrate so as to surround said integrated circuit chip and a lid structure bonded to an upper end of said side wall, said lid structure being bonded and electrically connected to said back electrode of said integrated circuit chip through a solder.

2. A packaged semiconductor device comprising:

an insulating substrate hating a first surface formed with a plurality of connection pads and a second surface formed with a plurality of external connection members each of which is electrically connected to a corresponding one of said connection pads through a via hole formed through said insulating substrate;

an integrated circuit chip bonded facedown on said first surface of said insulating substrate so that said integrated circuit chip is electrically connected to said connection pads through solder bumps said integrated circuit chip having a back electrode formed on a back surface thereof; and an electrically conductive cap covered on said first surface of said insulating substrate so that said integrated circuit chip is encapsulated in a space defined by said insulating substrate and said conductive cap, said conductive cap being composed of a side wall bonded at its lower end to said insulating substrate so as to surround said integrated circuit chip and a lid plate bonded to an upper end of said side wall, said back electrode of said integrated circuit chip being electrically connected to said conductive cap through an electrically conducting element, which is formed of a contact plate having a central region mechanically and electrically connected to said back electrode of said integrated circuit chip, said contact plate also including a peripheral portion sandwiched and electrically connected between said lid plate and said upper end of said side wall.

3. The packaged semiconductor device of claim 2, wherein said contact plate is in the form of a lead frame having a plurality of legs extending radially outwardly from said central region, a tip end of each of said plurality of legs being sandwiched and electrically connected between said lid plate and said upper end of said side wall.

4. A packaged semiconductor device comprising:

an insulating substrate having a first surface formed with a plurality of connection pads and a second surface formed with a plurality of external connection members each of which is electrically connected to a corresponding one of said connection pads through a via hole formed through said insulating substrate;

an integrated circuit chip bonded facedown on said first surface of said insulating substrate so that said integrated circuit chip is electrically connected to said connection pads through solder bumps, said integrated circuit chip having a back electrode formed on a back surface thereof; and an electrically conductive cap covered on said first surface of said insulating substrate so that said integrated circuit chip is encapsulated in a space defined by said insulating substrate and said conductive cap, said conductive cap being composed of a side wall bonded at its lower end to said insulating substrate so as to surround said integrated circuit chip and a lid structure bonded to an upper end of said side wall, said back electrode of said integrated circuit chip being bonded and electrically connected to said lid structure through a solder, wherein said lid structure includes a first lid member bonded to said upper end of said side wall, said first lid member having a plurality of via holes formed through said first lid member, and a second lid member bonded to said first lid member through a solder, said solder filling said via holes and extending to a lower surface of said first lid member so as to mutually bond said first lid member and said back electrode of said integrated circuit chip.

5. The packaged semiconductor device of claim 4, wherein said first lid member has a smooth curved concave upper surface, and said second lid member has a smooth curved convex under surface, the radius of curvature of said smooth curved concave upper surface of said first lid member being smaller than that of said smooth curved convex under surface of said second lid member.

* * * * *

UNITED STATES PATENT AND TRADEMARK OFFICE
CERTIFICATE OF CORRECTION

PATENT NO. : 5,723,904
DATED : March 3, 1998
INVENTOR(S) : Nobuo SHIGA

It is certified that error appears in the above-indentified patent and that said Letters Patent is hereby corrected as shown below:

Col. 9, line 58, (Claim 2, line 2) "hating" should be --having--.

Signed and Sealed this

Sixteenth Day of June, 1998

Attest:

BRUCE LEHMAN

Attesting Officer

Commissioner of Patents and Trademarks